United States Patent [19]

Feilchenfeld et al.

[11] 4,099,668
[45] Jul. 11, 1978

[54] MONITORING CIRCUIT

[75] Inventors: Michal M. Feilchenfeld, Pittsburgh; Kenneth E. Daggett, Monroeville, both of Pa.; Raymond A. Lloyd, Laurel, Md.

[73] Assignee: Westinghouse Electric Corp., Pittsburgh, Pa.

[21] Appl. No.: 736,796

[22] Filed: Oct. 29, 1976

[51] Int. Cl.² ................... G06F 11/00; G01R 15/12
[52] U.S. Cl. ............................. 235/304; 324/73 R; 324/73 AT
[58] Field of Search ............... 235/153 A, 153 AC; 324/73 R, 73 AT, 73 PC

[56] References Cited

U.S. PATENT DOCUMENTS

| 3,821,645 | 6/1974 | Vinsani | 235/153 AC X |
| 3,832,535 | 8/1974 | Vito | 324/73 AT X |
| 3,883,801 | 5/1975 | Hess | 324/73 R |
| 3,904,861 | 9/1975 | McNamara | 235/153 AC |
| 3,924,181 | 12/1975 | Alderson | 235/153 AC X |
| 3,988,670 | 10/1976 | Gariazzo | 235/153 AC X |

*Primary Examiner*—Jerry Smith
*Attorney, Agent, or Firm*—J. B. Hinson

[57] ABSTRACT

A monitoring circuit for digital circuits is disclosed. The monitor is primarily applicable to digital circuits which operate in a cyclic mode with the digital patterns generated during each cycle being repeated in a predictable manner. A predetermined number of expected bit patterns are stored in a programmable memory. The stored bit patterns correspond on a bit-by-bit basis to the bit patterns generated by the circuit being monitored when this circuit is operating normally. In the self-scan mode each pattern generated by the circuit being monitored is compared to each of the patterns stored in the memory in a sequential manner. Each time a pattern generated by the circuit being monitored is found to identically correspond to a pattern stored in the memory a valid pattern pulse is generated which steps a down counter one count. If this process does not result in the down counter being stepped the expected number of times during the operating cycle, a flip-flop is set indicating that the circuit being monitored has malfunctioned. Provisions are also included for counting the transitions of a digital signal during predetermined portions of the cycle of the circuit being monitored and for monitoring the polarity and amplitude of a predetermined number of analog voltages. The result of all of these tests are combined to generate a signal indicating the operational status of the circuit being monitored. The monitoring circuit may also be operated in a one-to-one correspondence mode. In this mode each bit pattern generated by the circuit being monitored are compared to bit patterns stored in a selected memory location. If these bit patterns are not identical, a malfunction signal is generated.

5 Claims, 4 Drawing Figures

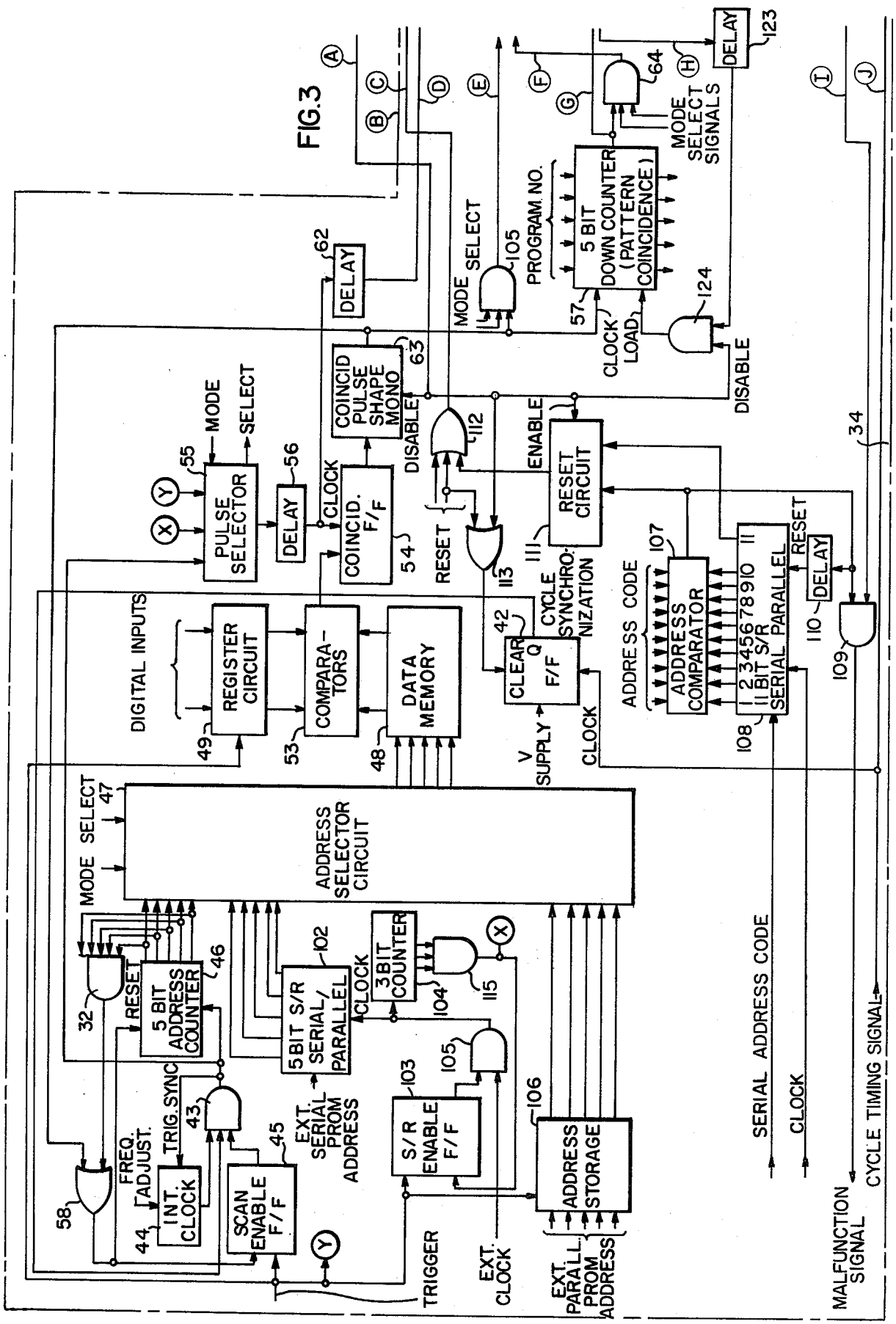

MONITORING CIRCUIT

BACKGROUND OF THE INVENTION

FIELD OF THE INVENTION

The invention relates to circuits for monitoring the operational status of circuits and more particularly to a circuit for determining the operational status of a digital circuit by comparing multibit digital signals indicative of the operational status of the circuit being monitored to stored multibit digital signals.

SUMMARY OF THE INVENTION

The monitoring circuit which is the subject of this invention is applicable to monitoring digital circuits which operate in a cyclic manner with the digital pattern generated during each cycle being repeated in a predictable manner. Two modes of operation are provided. These modes are referred to as the self-scan mode and the one-to-one correspondence mode. Circuitry for monitoring analog signals and counting the transitions of a signal are also provided if the application so requires.

The monitoring circuit includes a data memory in which a series of digital data words are stored. Each of the stored data words has a one-to-one bit correspondence to a bit pattern generated by the circuit being monitored when the operation of the monitored circuit is normal.

An address generator initiated by synchronizing signals from the circuit being monitored generates addresses which cause the data words stored in the memory to be selectively read and compared to the bit patterns generated by the circuit being monitored. The number of stored data words to which each pattern generated by the circuit being monitored is compared depends on the mode of operation of the monitoring circuit.

In the self scan mode, the address generator generates sequential addresses which cause each of the stored data words to be sequentially read. A group of bit patterns generated by the circuit being monitored is selected to be compared to the stored data words. Each bit pattern of the selected group is compared to each of the data words as these words are read from the memory. The data words are selected such that for each data word there is a bit pattern in the selected group having an identical one-to-one bit corresponding thereto. Each time an identical one-to-one bit correspondence between a selected bit pattern and a stored data word is detected a counter is advanced one count. At the end of each cycle of the circuit being monitored an error detection circuit interrogates the counter and generates an error signal if the expected number of identical one-to-one bit correspondence cases has not been detected.

In the one-to-one correspondence mode, each of the selected bit patterns generated by the circuit being monitored is compared to only one of the stored data words. This is accomplished by generating externally a single memory address for each of the selected bit patterns. A bit pattern and an address specifying the location of the data word to which the selected pattern is to be compared are coupled to the monitoring circuit. Synchronizing pulses from the circuit being monitored initiates the reading by the specified data word. The specified data word and the selected bit pattern are compared in a digital comparator and a bit pattern fault signal is generated if the data word and selected bit pattern are not identical on bit-by-bit basis. For certain class of circuits operating asynchronously but at a multiple of the prevailing trigger rate, monitoring for malfunction is performed by counting the number of transitions during a specified time period(s) throughout the operation cycle. Such asynchronous circuits are monitored by counting circuits which count the transitions of a signal generated by the circuit being monitored. A multibit digital signal identifying the time period during which transitions are to be counted is coupled to one input by a digital comparator. A digital signal specifying the time period during which transitions are to be connected is coupled to the second input by the comparator. When the comparator indicates that these two signals are identical, an enable signal is generated which couples the signal whose transitions are to be counted to a counter causing it to count each transition. At the termination of the specified time period a count detect circuit determines if the expected number of transitions have occurred. If the expected number of transitions have not occurred a count fault signal is generated.

An analog comparator is also included to monitor analog signals to generate an analog error signal if the monitored signals are not within prosecuted limits.

The pattern fault, count fault and analog error signals are combined to generate a composite malfunction signal. This malfunction signal operates a malfunction indicator which is a part of the monitoring circuit. Circuitry is also provided which permits a particular monitoring circuit to be interrogated by an external system, such as a digital computer, to determine the status of its composite malfunction signal.

DESCRIPTION OF THE DRAWINGS

FIGS. 3 and 3A are a more detailed logic diagram of the monitoring circuit.

DETAILED DESCRIPTION

Figure 1:
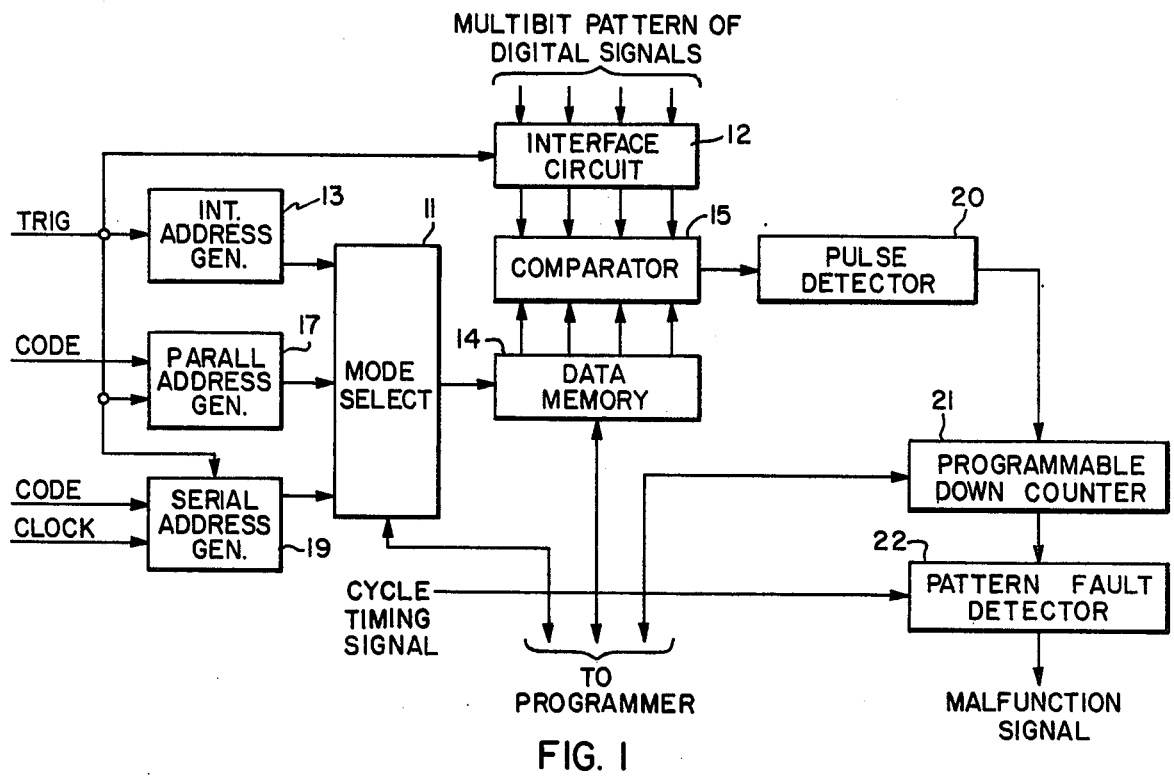
FIG. 1 is a function block diagram of the monitoring circuit.

FIG. 1 is a simplified functional block diagram of the monitoring circuit which is the subject of this invention. The monitoring circuit may either be operated in the self-scan or the one-to-one correspondence modes. In either case the circuit being monitored generates a series of bit patterns which are coupled to the monitoring circuit as inputs. Each of the patterns is indicative of the operational status or the circuit being monitored at the time the pattern is generated.

In the self-scan mode a selected number of patterns are compared to one or more digital data words which are stored in a memory. Normal operation is inferred from a one-to-one bit correspondence between each of the selected bit patterns, generated by the device being monitored, and at least one of the bit patterns stored in the memory resulting in the total number of correspondence cases per cycle being equal to the number or selected bit patterns. In the one-to-one correspondence mode, each of the selected bit patterns generated by the device being monitored is compared to a selected bit pattern stored in the memory. Normal operation is inferred by a one-to-one correspondence of these values. In either mode, the highest number of selected bit patterns is determined by the capacity of the memory. The system may also include analog signal and frequency monitoring circuits although these features are not illustrated in FIG. 1 and not required by many applications.

In the self-scan mode the monitoring circuit illustrated in FIG. 1 receives a cycle timing signal from the circuit being monitored. Each pulse of this signal defines the beginning of a cycle of the circuit being monitored. A pulsed trigger signal to initiate the comparison of each of the selected bit patterns generated by the device being monitored to the stored bit patterns is also generated by the device being monitored. Between adjacent pulses of the trigger signal, the monitoring circuit compares the multibit pattern coupled to the monitoring circuit to each of the multibit patterns stored in the digital memory. When it is found that the multibit pattern identically corresponds to a pattern stored in the memory, a valid pattern pulse is generated which steps a programmable down counter one count. At the end of the cycle of the device being monitored the count stored in the programmable down counter is interrogated and if the number count in this counter indicates that the counter was not stepped the number of times expected, a malfunction signal is generated. At the beginning of each cycle of the circuit being monitored, the down counter is set to a value equal to the number of expected one-to-one bit correspondence cases per cycle. A zero count at the end of each cycle of the circuit being monitored indicates proper operation of the monitored circuit.

The detail operation of the monitoring circuit illustrated in FIG. 1 will now be described utilizing the timing chart illustrated in FIG. 2. FIG. 1 is a simplified functional block diagram and identifies the major functions of the monitoring circuit. The cycle timing signal 10 (FIG. 2) is a digital signal comprising a train of pulses with each pulse defining the beginning of the operating cycle of the circuit being monitored. A trigger signal 24 is also a digital signal comprising a train of pulses with each pulse defining a time interval when the multibit pattern from the circuit being monitored is stable. This signal is coupled to the interface circuit 12, the internal address generator 13, the parallel address generator 17 and the serial address generator 19 to synchronize the operation of these circuits with the circuit being monitored.

The multibit pattern of digital signals from the circuit being monitored is coupled to an interface circuit 12. Each pulse of the trigger signal causes flip-flops to be set to a level corresponding to the level of the bits of multibit pattern of digital signals from the circuit being monitored. This produces a stable multibit digital signal at the output of interface circuit 12 having a one-to-one correspondence to the pattern from the circuit being monitored.

The trigger pulse is also coupled to the internal address generator 13. Each pulse of trigger signal causes the internal address generator 13 to cycle generating a series of sequential digital numbers. Mode address select circuitry 11 also receives an external mode select signal. In response to the mode select signal, these sequential numbers are coupled through mode address select circuitry 11 to data memory 14 as addresses to sequentially read data. The data stored in data memory 14 is selected such that for each of the selected bit patterns generated by the circuit being monitored there will be a memory location at which a data word having an identical bit pattern is stored. Thus during each count cycle of the address counter 13 all of the stored bit patterns are read.

The output of the interface circuit 12 and the data memory 14 are coupled to a comparator 15. The comparator 15 compares the output of the interface circuit 12 to the output of the data memory 14 on a bit-by-bit basis and generates a signal indicating that the signals are either different or identical. If the comparator 15 indicates that the output of the interface circuit 12 is identical with the output of the data memory 14, on a bit-by-bit basis, a signal is coupled to a pulse detector 20 causing this circuit to generate a pulse which steps a programmable down counter 21 one count.

At the beginning of each cycle of the circuit being monitored the programmable down counter 21 is set to a number corresponding to the selected number of patterns. As previously described each pulse of the trigger signal causes the bit pattern from the device being monitored appearing at the input of interface circuit 12 to be compared to the bit patterns read sequentially from the data memory 14. Each time the bit pattern from the device being monitored is found to identically correspond to a bit pattern read from the data memory 14 a valid pattern pulse is generated which steps the programmable down counter 21 one count as described above. After the circuit being monitored has progressed through its entire cycle a pulse of the cycle timing signal 10 indicating the end of the cycle is coupled from the circuit being monitored to the pattern fault detector circuit 22. The pattern pulse detector circuit 22 also receives a signal from the programmable down counter 21 indicating whether or not the programmable down counter has been stepped the proper number of times. If the programmable down counter has not been stepped the expected number of times, the pattern pulse detector circuit 22 generates an output signal indicating that the circuit being monitored has malfunctioned.

As previously described the data memory 14 is a programmable memory. External programming means (not shown) is utilized to store data words having bit patterns corresponding to the bit patterns to be monitored in this memory. The programmer, the memory and the other portions of the monitoring circuit can be implemented using standard logic circuits.

Figure 3A:
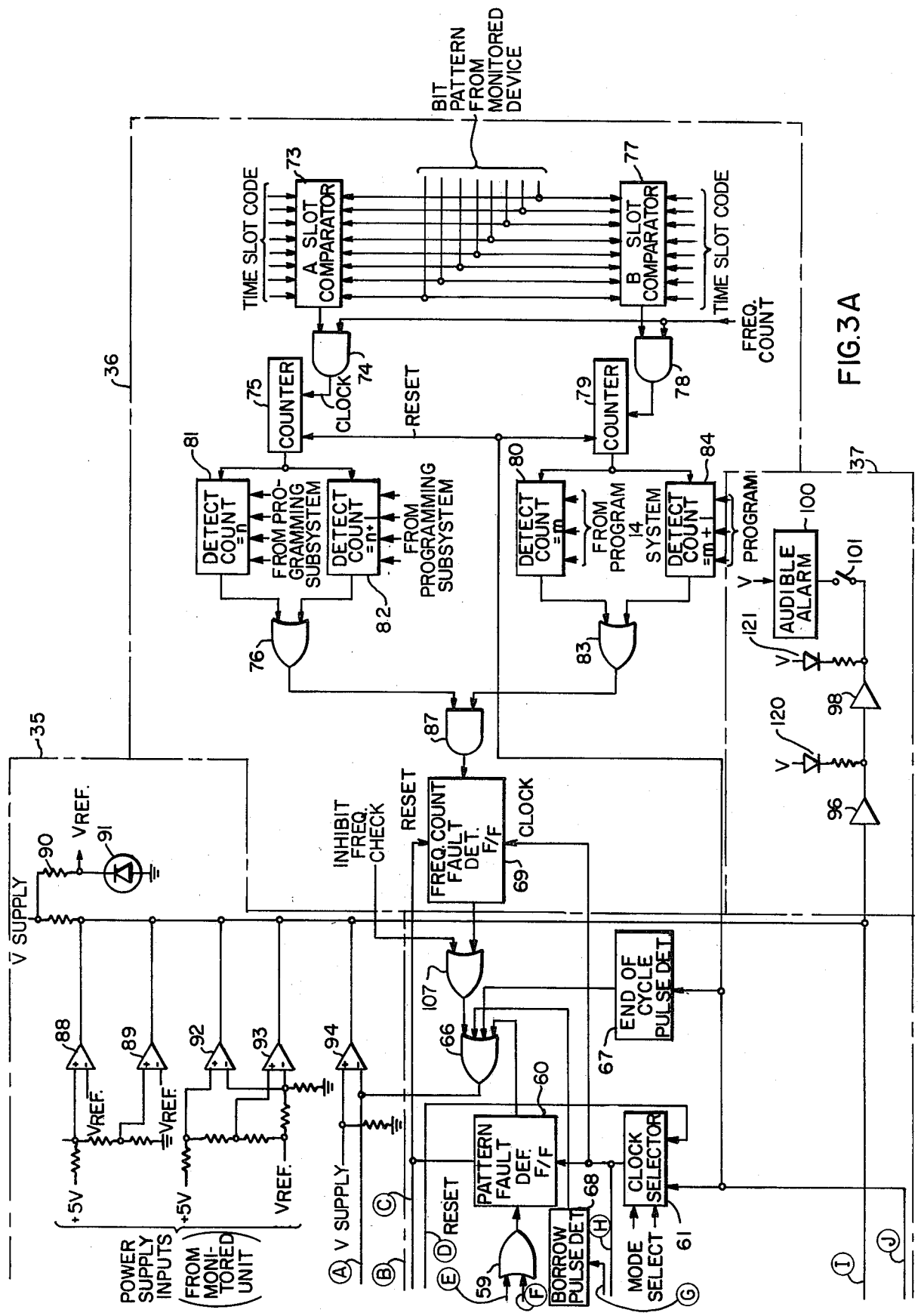

The monitoring circuit illustrated functionally in FIG. 1 is illustrated in more detail in FIGS. 3 and 3A. Additionally, the system illustrated in FIGS. 3 and 3A includes circuitry for monitoring the levels of analog signals and a section for counting the number of transitions of a digital signal associated with the circuit being monitored. The time period during which transitions are counted is specified by an external signal which may be generated by the device being monitored.

The portion of the monitoring circuit which compares the selected digital bit patterns generated by the device being monitored to bit patterns stored in a digital memory is enclosed within a dotted line and indicated generally at reference numeral 34. Circuitry for monitoring analog voltages and for counting the transitions of a digital signal are similarly enclosed within dotted lines and identified by reference numerals 35 and 36. Error signals from each of these sections are combined to operate indicator circuitry illustrated generally at reference numeral 37.

The monitoring circuit illustrated in FIG. 3 is capable of operating in two basic modes as previously discussed. In the self-scan mode the addresses for the data to be read from the data memory 14 (FIG. 1) is supplied by a counter forming an integral portion of the monitoring circuit. In a second mode, referred to as the one-to-one correspondence mode, the addresses are supplied from an external source in either serial or parallel form. The operation of monitoring circuit will first be described using internally generated addresses (referred to as the self-can mode) and then the one-to-one correspondence mode of operation will be described.

Figure 2:
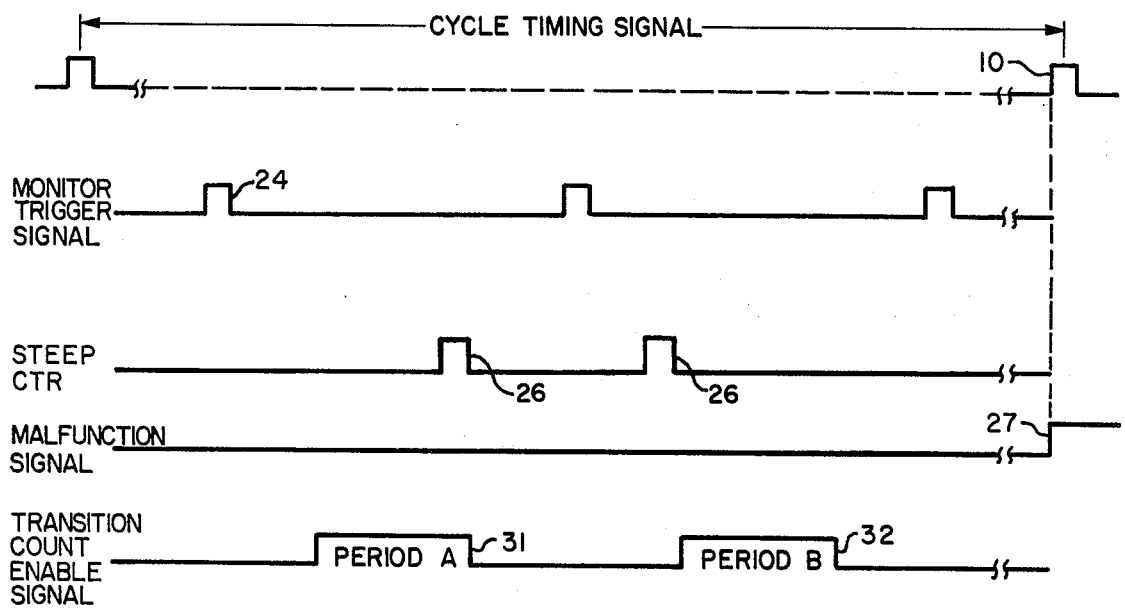
FIG. 2 is a timing chart for the monitoring circuit illustrated in FIG. 1.

In the self-scan mode, the operation of the monitoring circuit is synchronized by the cycle timing signal illustrated generally at reference numeral 10 of FIG. 2. At switching on, or after any resetting of the monitoring circuit the first pulse of the cycle timing signal resets the cycle synchronizing flip-flop 42 (FIG. 3) which in turn enables gate 43. The other inputs to this gate are the output of internal clock 44 and the output of a scan enable flip-flop 45.

Between adjacent pulses of the cycle timing signal, a series of pulses comprising the monitor trigger signal, illustrated generally at reference numeral 24 of FIG. 2, are generated by the circuit being monitored. Each pulse of the monitor trigger signal sets the enable flip-flop 45. The output signal of the scan enable flip-flop 45 in combination with the output signal of the cycle synchronization flip-flop 42 gates pulses from the internal clock 44 to the clock input terminal of a five bit address counter 46. This causes this counter to begin counting to generate addresses for data memory 48. The output bits of address counter 46 are also coupled to the input terminals of a gate 32 to generate a scan enable flip-flop reset signal when the desired number of addresses have been generated. This signal is coupled through an OR gates 58 to reset the scan enable flip-flop 45 and terminates the counting of the address counter 46. Utilizing the five bit address counter permits the data memory 48 to have 32 separate storage locations.

The pulses comprising the monitor trigger signal are also coupled to register circuits 49. This register circuit 49 also receives in parallel the selected multibit digital signals indicative of the operational status of the circuit being monitored. Each pulse of the monitor trigger signal causes the each bit of this register to be set to a level corresponding with their respective inputs at that particular time. Setting of the register circuits 49 generates at the output of this circuit a parallel multibit digital signal with the level of each bit corresponding to the level of the corresponding input bit from the circuit being monitored.

Address selector circuit 47 is controlled by external mode select signals. In self-scan mode, the address generated by the five bit address counter 46 are coupled through the address selector circuit 47 to the data memory 48 causing the data stored at the location specified by the address to be read to produce a parallel multibit signal at the output of the data memory 48. The output signals of the register 49 and the data memory 48 are coupled to the inputs of a comparator circuit 53. The output of the comparator circuit is coupled as a D input signal to a coincidence flip-flop 54. In this mode the pulses which increment the address counter 46 are also coupled to the clock terminal of the coincidence flip-flop 54 through pulse selector 55 and delay 56. Pulse selector circuit 55 selects either the clock signal which steps the five bit address counter 46 or an alternate pulse as the clock signal for coincidence flip-flop 54 depending on the operating mode. The output signal of the pulse selector circuit 55 is delayed slightly by a delay circuit 56 to assure that the outputs from the data memory 48 and the register circuits 49 have stabilized and that the comparison is complete prior to clocking of the coincidence flip-flop 54.

If the output of comparator 53 indicates that the output signals from the register circuit 49 are identical to the output of the data memory 48, the state of the coincidence flip-flop 54 will change with the leading edge of the clock pulse derived from delay circuit 56. The output signal of the coincidence flip-flop 54 and a disable signal are coupled to a coincidence pulse shape mono (monostable multivibrator circuit) circuit 63. The disable signal disables the mono circuit when a malfunction of the device being monitored is detected. This signal will be explained in more detail subsequently. Assuming that the coincidence pulse shaper mono circuit 56 is enabled (i.e. disable signal not present) a pulse will be generated at its output by the change in the state of the coincidence flip-flop 54 which will step the five bit down counter 57 one count. This pulse is also coupled through an OR circuit 58 to reset the scan enable flip-flop 45 and the five bit address counter 46. Resetting the scan enable flip-flop 45 inhibits scanning until the next pulse of the monitor trigger signal arrives to set the scan enable flip-flop 45 to repeat the cycle. The output pulse of the coincidence pulse mono 63 may occur at any point between adjacent pulses of the monitor trigger signal. Two typical pulses are illustrated at reference numerals 26 of FIG. 2.

When the five bit down counter 57 counts down to zero a borrow signal is generated. The borrow signal from the five bit down counter 57 is controlled by the mode select signals in a gate 64. The output signal of gate 64 is coupled through an OR circuit 59 to the "D" input to the pattern fault detector flip-flop 60. The mode select signals coupled to the input of gate 64 permit the borrow pulse from the five bit down counter to be coupled to the pattern fault detector flip-flop only when the monitor is in the self-can mode. The cycle timing signal is coupled through mode clock selector circuit 61 to generate the clock signal for the pattern fault detector flip-flop 60. Mode clock selector 61 is arranged such that in the self-scan mode the clock signal to the pattern fault detector flip-flop 60 is formed by the pulses comprising the cycle timing signal. In all other modes the clock signal to this flip-flop is the output of delay circuit 62. The operation of this circuit will be explained in detail later.

The output signal of clock selector circuit 61 is also coupled to the input of a delay circuit 123. The output signal of delay circuit 123 is combined in a gate circuit 124 with the disable signal to form a signal which sets the number stored in the down counter 57 equal to the number of patterns to be compared to data words stored in data memory 48 during each cycle.

If at the end of the cycle of the circuit being monitored the borrow signal at the output of the five bit down counter 57 is not present, thereby indicating that either more or less than the expected number of coincidences between the multibit digital signals from the device being monitored and the multibit output signals of the data memory 38 have occurred, the pattern fault detector flip-flop 60 will be set generating a signal at the output of this flip-flop indicating that an error has been detected. This signal is combined in a NOR gate 66 with the output of the end of cycle pulse detector 67, the output pulse of the borrow pulse detector 68 and the frequency count fault detector flip-flop 69. This circuit is arranged such that if either of these signals indicates malfunction an overall malfunction signal will be generated. The basic purpose of this circuit is to provide a check for the presence of the borrow pulse and the pulses of the cycle timing signal, and generate a malfunction signal if either of these pulses is missing. This provides a high degree of assurance that the monitoring circuit is working properly because no error signal will be generated unless borrow pulse and cycle timing signals are present.

The borrow pulse detector 68 and the end of cycle pulse detector 67 are basically retriggerable mono-stable multivibrators with a period exceeding the cycle of the synchronous device being monitored. This means that the output of each of these circuits will not change so long as the borrow pulse and the end of cycle pulses are arriving at their expected rates. The absence of either of these signals at the input of gate 66 will cause the output of this gate to immediately change to generate a malfunction signal. This provides a good check for the proper operation of the entire monitor.

Many synchronous devices may control one or more other circuits whose operation is not synchronous with the main device. These circuits however may be driven at a rate which is an exact multiple of the trigger rates of the main device. In this nonsynchronous case the status of the circuit cannot be ascertained by the technique just described and a new error sensitive parameter is required. A convenient parameter is the count of the number of transitions of a digital signal within a specified time period. The circuit monitor includes this type of circuit in order to cope with the non-synchronous case.

An example of a nonsynchronous circuit is a pulse generator whose frequency is changed in discrete and equal steps over a known time period. A reliable check on the proper operation of such a generator is provided by counting the number of transitions of the output signal during specified time periods.

The monitoring circuit illustrated in FIG. 3 includes circuitry for monitoring the number of transitions of a digital signal which occurs during specified time periods. The transitions of the signals to be monitored may not be in phase with the cycle timing and trigger signals so that an ambiguity of one count may exist without indicating a malfunction of the monitored device. Means are included in the monitoring circuit to accound for this ambiguity.

For purposes of illustration, the periods during which transitions are counted are arbitrarily designated as A and B. Enable signals defining these periods are illustrated at reference numerals 31 and 32 (FIG. 2). The operation of the transition count detector will first be described with reference to period A and then with respect to period B.

A digital signal time slot code indicative of the time period during which the transitions are to be counted is generated externally to the monitoring circuit and coupled as one input of the A slot comparator 73 (FIG. 3A). A multibit pattern generated by the circuit being monitored is coupled to the second input of a comparator 73. When these two signals are identical, the A slot comparator 73 generates an enable signal indicating that counting of the transitions of the input signal should begin. This signal is illustrated at reference numeral 31 (FIG. 2).

The enable signal and the signal whose transitions are to be counted are combined in a gate circuit 74 to generate the clock signal for the A slot frequency counter 75. The output of the A slot frequency counter 75 is coupled to a detect count = N and a detect count = N+1 circuits 81 and 82. The value of "N" is selected such that it is equal to the lowest number of transitions expected within the A slot and the N+1 is equal to the highest expected level to account for the possible count of one ambiguity previously discussed. The outputs of these two circuits are coupled to the input of an OR circuit 76. The output of this circuit is a digital signal with a logic "one" indicating that the expected number of transitions have occurred and a logic "zero" indicating that the number of transitions were other than that expected.

The operation of the B slot circuit, comprising comparator 77, counter 79, detector circuits 80 and 84, and combining gate 83, is identical with A slot circuit described above. Therefore, the operation of this circuit will not be described in detail.

The output signals of OR gates 76 and 83 are combined in an AND gate 87 to generate the D input to the frequency count fault detector flip-flop 69. If the outputs of either of the OR circuits or both is a logic zero indicating that the number of transitions in the monitored signal was other than that expected in either of these periods the frequency count detector flip-flop 69 will be set indicating that a frequency error occurred. The clock for this flip-flop 69 is the output signal of clock selector circuit 61. The output signal of the frequency count fault detector flip-flop 69 and an inhibit frequency check signal form the input signals to a gate 107. If the inhibit frequency cycle signal is a logic "one" the output of flip-flop 69 is coupled to one input of gate 66 to generate at the outputs of this circuit a composite error signal.

Additionally the monitoring circuit includes analog monitors for monitoring the amplitude of a predetermined number of analog voltages. This circuitry is illustrated generally at reference numeral 35.

The circuitry for monitoring both the high and low limits of an analog voltage requires a stable reference voltage and two comparators whose outputs can be "ORed" together to produce a composite signal. Typical comparators for checking the high and low level of positive voltage power supplies are respectively illustrated at reference numeral 88 and 89. Two other comparators for checking the voltage level of negative power supply are respectively illustrated at reference numerals 92 and 93. An additional comparator 94 is utilized as a convenient means for combining the output of gate 66 with the output signals of comparators 88, 89, 92 and 93 to produce the composite malfunction signal. The outputs of these comparators are wired together to in an "OR" arrangement. A stable reference voltage is supplied provided by the series combination of a resistor 90 and a Zener diode 91. This reference voltage is coupled directly to one input of comparators 88 and 89 and to one input of comparators 92 and 93 through A resistor divider network. The other input of the comparators is coupled to the voltage to be monitored through a resistor divider network.

The composite malfunction signal is coupled through an inverting amplifier 96 to a green light emitting diode 120 to indicate that the monitored circuit is operating normally. An additional inverter 98 is coupled to a red light emitting diode 121 which is turned on to indicate a malfunction has been detected. Additionally inverter 98 is coupled to an audible alarm 100 through a disable switch 101 to provide an audible indication of malfunction if such an indication is desired. Since the pattern fault detector flip-flop 69 and the frequency count flip-flop 69 are clocked by the pulses of the cycle timing signal 24, a malfunction indications due to digital faults will be coincident with the pulses of this signal. A typical malfunction signal due to detected digital faults is illustrated at reference numeral 27, FIG. 2. Detection of an analog fault immediately generates malfunction signals.

The above discussion is a complete description of the monitoring circuit's operation in the self-scan mode. An additional mode is provided for checking individual patterns under the control of an external system such as a digital computer. This mode is referred to as the one-to-one correspondence mode will now be described.

In the one-to-one correspondence mode, addresses for reading the data from memory 48 are supplied one at a time by an external system. Each address signal consists of a five bit digital signal. The address may be shifted serially into register 102 or provided in parallel to address storage memory 106. An external clock to shift serial addresses into register 102 is provided to shift register 102 through an AND gate 105 and a serial mode enable flip-flop 103. The serial enable flip-flop 103 is set by the pulses of the trigger signal and disabled by a 3-bit counter 104 when 5 bits have been shifted into the shift register.

Signals are provided to the mode select logic 47 to couple the address from the serial address shift register 102 or the address storage memory 106 to the data memory 48. This causes data word stored at the specified address to be read from data memory 48 and compared to the output signals of the register circuit 49 as previously described with respect to the self-scan mode. Since only one address is provided, the bit pattern coupled to the input of register circuit 49 will be compared to only one of the bit patterns stored in data memory 48.

The reset signals (output of gate 115) for flip-flop 103 is coupled through clock pulse selector logic 55 to trigger delay 56 and delay 62. The output of delay 56 generates a clock signal for the coincidence flip-flop 54 to indicate whether or not there is a one-to-one correspondence between the output of the register circuit 49 and the output of the data memory 48. The output of the coincidence flip-flop 54 is coupled through the coincidence pulse shape mono 63 to one input of a gate 105. Other inputs to gate 114 are the mode selection signals which disable this gate except in the one-to-one correspondence mode. The output signal from the coincidence pulse shape mono 63 is coupled to the D input of the pattern fault detector flip-flop 60 through OR gate 59. The output signal of delay 62 is coupled through mode clock selector circuit 61 to produce a clock signal for the pattern fault detection flip-flop 60. Thus if the output of the coincidence pulse shape mono 63 indicates that no coincidence occurred the pattern fault detection flip-flop 60 will be set to indicate an error. This signal will be coupled through the NOR circuit 66 to generate at the output of this circuit an error signal.

Parallel address may also be provided to the monitoring circuit in the one-to-one correspondence mode. Parallel addresses are coupled to the input of address storage circuit 106. This address is clocked into the storage circuit 106 by the trigger pulse and coupled to data memory 48 by the address mode selector logic 47. Clock signals are provided to coincidence flip-flop 54 and pattern fault flip-flop 60 by coupling the trigger pulses to pulse selector 55. The remainder of the operational cycle is identical to that described above with respect to the serial external mode.

The system illustrated in FIG. 3 also includes logic permitting the status of the error signal to be interrogated by an external system. This permits a signal external system to interrogate a series of the monitors thereby permitting complex monitoring systems to be constructed.

To operate in this mode each of the monitoring circuits is assigned an address. This address forms one input of an address comparator 107. To interrogate the particular module the address of the module is shifted into a shift register 108. The outputs of the shift register form a second input of the address comparator 107. When the comparator indicates that the contents of the shift register 108 are identical to the address assigned to the particular monitoring circuit the comparator output enables gate 109 so that the status of the line is available to the external system.

The output signal of the comparator is also coupled to the input of a delay circuit 110 to reset the shift register 108 so that a new cycle can be started. The capacity of the shift register 108 is one bit larger than that required to specify the address of the monitoring circuit. The code message originating from the external system contains also one extra bit above the address code which is shifted into the extra bit position of register 108. This extra bit if in logic zero state indicates only interrogation of the monitoring circuit. If the extra bit is in logic one, it indicates also a resetting command. The output of the shift register corresponding to this bit is ANDed with the output of the comparator to reset circuit 111 and coupled through an OR circuit 112 to generate the master reset signal to the two flip-flops 60 and 69. This permits the error signal to be cleared by the external system. The OR circuit 112 also includes additional inputs permitting the error signal to be cleared from a local control panel or other suitable locations.

We claim:
1. A monitoring circuit comprising;
(a) input means for accepting multibit digital signals indicative of the operational status of a device being monitored;
(b) digital storage means having stored therein at predetermined address locations a plurality of multibit digital signals having a predetermined relationship to said multibit digital signals indicative of the operational status of the device being monitored;
(c) means for sequentially reading said stored multibit digital signals and for comparing each of said stored multibit digital signals to each of said signals indicative of the operational status of the device being monitored to generate a pulse each time one of said signals indicative of the operational status of the device being monitored is found to be identical to one of said stored multibit digital signals;
(e) counter means responsive to said pulse to generate a digital number indicative of the number of said pulses which occur within a predetermined time period;
(f) fault detector means responsive to said digital number to generate a malfunction signal if said digital number is less than a preselected value.
2. A monitoring circuit in accordance with claim 1 further including means for interrogating said monitoring circuit to determine the status of said malfunction signal in response to an external signal.

3. A monitoring circuit in accordance with claim 1 further including means for monitoring a predetermined number of analog signals and for generating an analog malfunction signal when one of said analog signals is not within prescribed limits.

4. A monitoring circuit in accordance with claim 3 further including means for combining said malfunction signal and said analog malfunction signal to generate a composite malfunction signal.

5. A monitoring circuit in accordance with claim 1 further including means for counting the transitions of a digital signal for a predetermined time period and for generating an error signal if the number of transitions counted are not within prescribed limits.

* * * * *